United States Patent
Huang (10) Patent No.: US 9,548,122 B2
(45) Date of Patent: Jan. 17, 2017

(54) LEVEL SHIFT DRIVER CIRCUIT CAPABLE OF REDUCING GATE-INDUCED DRAIN LEAKAGE CURRENT

(71) Applicant: eMemory Technology Inc., Hsin-Chu (TW)

(72) Inventor: Po-Hao Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/711,765

(22) Filed: May 13, 2015

(65) Prior Publication Data

US 2016/0013776 A1 Jan. 14, 2016

Related U.S. Application Data

(60) Provisional application No. 62/022,166, filed on Jul. 8, 2014.

(51) Int. Cl.
*G11C 16/08* (2006.01)
*G11C 17/16* (2006.01)
(Continued)

(52) U.S. Cl.
CPC ............. *G11C 16/08* (2013.01); *G11C 16/10* (2013.01); *G11C 16/26* (2013.01); *G11C 17/04* (2013.01); *G11C 17/08* (2013.01); *G11C 17/146* (2013.01); *G11C 17/16* (2013.01); *G11C 17/18* (2013.01); *G11C 29/76* (2013.01); *H01L 23/528* (2013.01); *H01L 27/0629* (2013.01); *H01L 27/11206* (2013.01); *H01L 27/11524* (2013.01);

(Continued)

(58) Field of Classification Search
CPC ......... G11C 16/00; G11C 16/08; G11C 16/10; G11C 16/26; G11C 17/00; G11C 17/04; G11C 17/08; G11C 17/14; G11C 17/146; G11C 17/16; G11C 17/18; G11C 29/00; G11C 29/76; H01L 23/00; H01L 23/5252; H01L 23/528; H01L 27/00; H01L 27/06; H01L 27/0629; H01L 27/112; H01L 27/11206; H01L 27/115; H01L 27/11524; H01L 29/10; H01L 29/1079; H01L 29/49; H01L 29/4961; H01L 29/93; H03K 3/00; H03K 3/356; H03K 3/356182
USPC ...................................................... 327/108
See application file for complete search history.

(56) References Cited

U.S. PATENT DOCUMENTS

5,444,396 A 8/1995 Soneda
6,801,064 B1 10/2004 Hunt
(Continued)

*Primary Examiner* — John Poos
*Assistant Examiner* — David Mattison
(74) *Attorney, Agent, or Firm* — Winston Hsu; Scott Margo (57) ABSTRACT

A level shift driver circuit comprises a level shift circuit and a driver circuit. The driver circuit comprises a first and a second P-type transistors and a first and a second N-type transistors coupled in series. When a first input signal of the level shift circuit is at an operative voltage, the level shift circuit turns off the second N-type transistor. A control terminal of the first N-type transistor receives the operative voltage to avoid a gate-induced drain leakage current of the second N-type transistor. When the first input signal is at a system base voltage, the level shift circuit turns off the first P-type transistor. A control terminal of the second P-type transistor receives the operative voltage to avoid a gate-induced drain leakage current of the first P-type transistor.

20 Claims, 8 Drawing Sheets (51) Int. Cl.

| | | |
|---|---|---|
| *G11C 17/18* | (2006.01) | |
| *G11C 16/10* | (2006.01) | |
| *G11C 16/26* | (2006.01) | |
| *G11C 17/04* | (2006.01) | |
| *G11C 17/08* | (2006.01) | |
| *H01L 23/528* | (2006.01) | |
| *H01L 29/93* | (2006.01) | |
| *H01L 27/112* | (2006.01) | |
| *H01L 27/06* | (2006.01) | |
| *H01L 29/10* | (2006.01) | |
| *H01L 29/49* | (2006.01) | |
| *H01L 27/115* | (2006.01) | |
| *H03K 3/356* | (2006.01) | |
| *G11C 17/14* | (2006.01) | |
| *G11C 29/00* | (2006.01) | |
| *H01L 23/525* | (2006.01) | |

(52) U.S. Cl.
CPC ...... *H01L 29/1079* (2013.01); *H01L 29/4916* (2013.01); *H01L 29/93* (2013.01); *H03K 3/356182* (2013.01); *H01L 23/5252* (2013.01); *H01L 2924/0002* (2013.01)

(56) References Cited

U.S. PATENT DOCUMENTS

| | | |
|---|---|---|
| 7,183,817 B2 | 2/2007 | Sanchez |
| 7,554,361 B2 | 6/2009 | Kim |
| 7,646,653 B2 | 1/2010 | Choi |
| 7,876,612 B2 | 1/2011 | Parent |
| 8,077,538 B2 | 12/2011 | Bollu |
| 2004/0207450 A1* | 10/2004 | Ando .................. H03K 3/012 327/333 |
| 2005/0007149 A1 | 1/2005 | Svensson |
| 2011/0148464 A1* | 6/2011 | Hatakeyama ...... H03K 19/0027 326/63 |

\* cited by examiner

LEVEL SHIFT DRIVER CIRCUIT CAPABLE OF REDUCING GATE-INDUCED DRAIN LEAKAGE CURRENT

CROSS REFERENCE TO RELATED APPLICATIONS

This non-provisional application claims priority of U.S. provisional application U.S. 62/022,166, filed on Jul. 8, 2014, included herein by reference in its entirety.

BACKGROUND OF THE INVENTION

1. Field of the Invention

The invention relates to a level shift driver circuit, and more particularly, a level shift driver circuit capable of reducing gate-induced drain leakage current.

2. Description of the Prior Art

When the level shift driver circuit is used to control high voltage output, the large voltage difference between gate and drain of an output transistor may cause a gate-induced drain leakage current (GIDL) on the output transistor. The current leakage not only causes greater power consumption but also requires greater area for the high voltage supply circuit to provide such high driving current.

Figure 1:
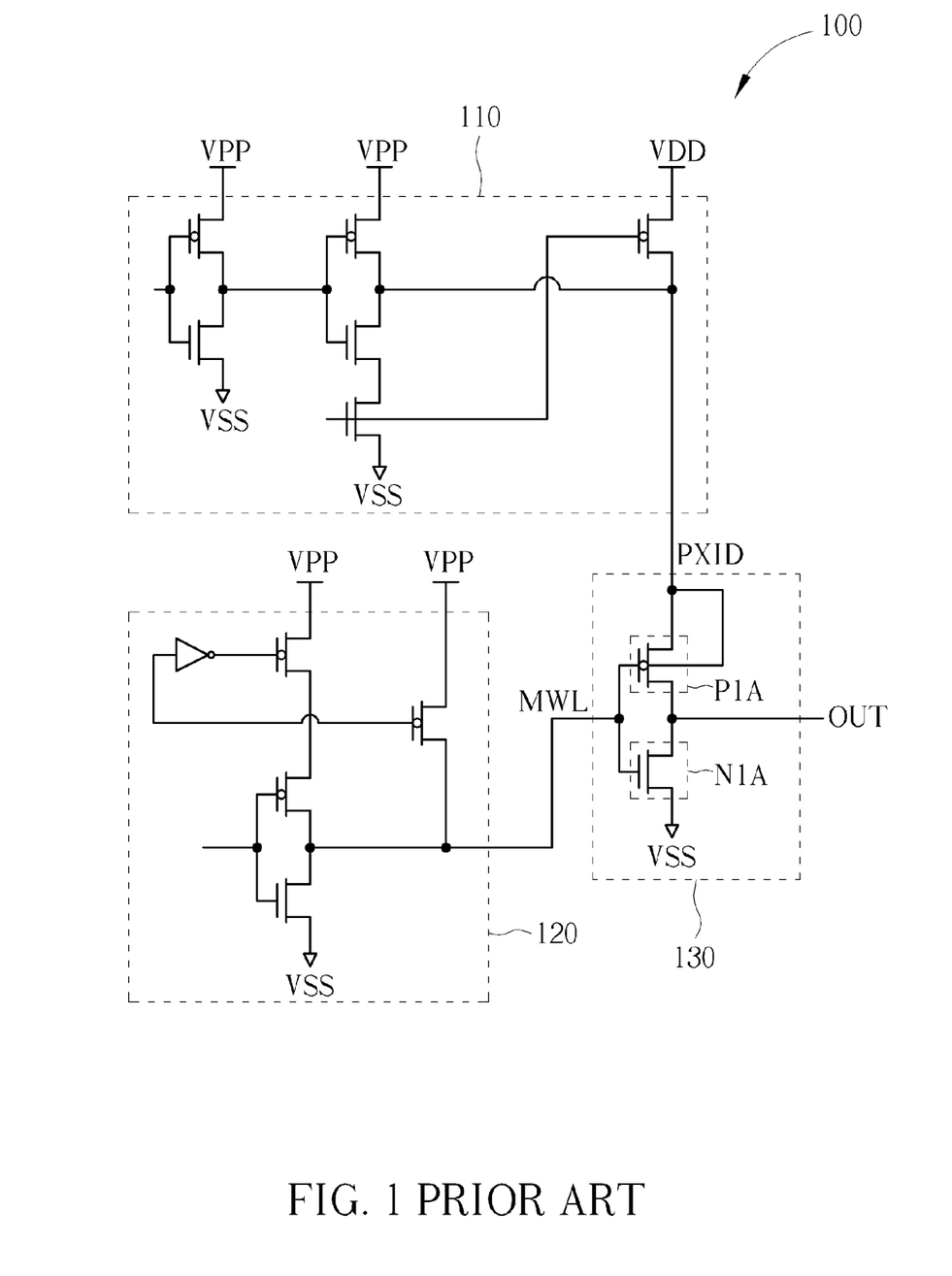
FIG. 1 shows a driver circuit according to a prior art.
Figure 2:
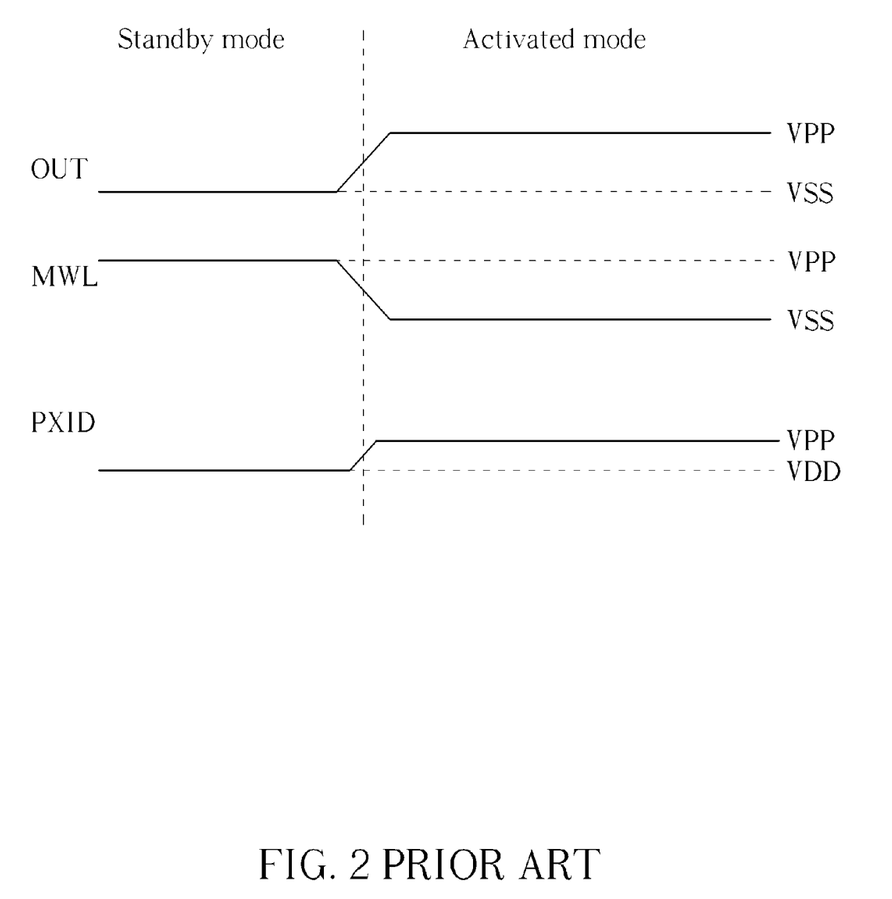
FIG. 2 shows the timing diagram of the driver circuit in FIG. 1.

To solve the GIDL current, U.S. Pat. No. 7,646,653 discloses a driver circuit 100 to reduce the GIDL current as shown in FIG. 1. The driver circuit 100 comprises a PXID driver circuit 110, a MWL signal generating circuit 120 and an output driver circuit 130. FIG. 2 shows the timing diagram of the driver 100.

When the driver circuit 100 is in a standby mode, the signal PXID outputted by the PXID driver circuit 110 will be an operative voltage VDD and the MWL signal generating circuit 120 will output the signal MWL of a driving voltage VPP, where the driving voltage VPP is higher than the operative voltage VDD. Since the N-type transistor N1A is turned on and the P-type transistor P1A is turned off, the voltage level of the output terminal OUT of the driver circuit 100 will be pulled down to the ground voltage VSS. In other words, with the aid of the PXID circuit 110, the voltage difference between the terminals of the P-type transistor P1A may be reduced, which results in the reduction of GIDL current when the driver circuit 100 is in the standby mode of operation.

However, when the driver circuit 100 is activated, the signal PXID outputted by the PXID driver circuit 110 will be at the driving voltage VPP and the MWL signal generating circuit 120 will output the signal MWL of the ground voltage VSS if the address bit of the driver circuit 100 is selected. Therefore, the voltage level of the output terminal OUT of the driver circuit 100 will be pulled up to the driving voltage VPP by the P-type transistor P1A. However, since the gate of the N-type transistor N1A is at the ground voltage VSS and the drain of the N-type transistor N1A is at the driving voltage VPP, a significant GIDL current may be induced by the great voltage difference on the gate and drain of the N-type transistor N1A.

Namely, the driver circuit 100 taught in U.S. Pat. No. 7,646,653 can only reduce the GIDL current in the standby mode of the driver circuit 100 but cannot reduce the GIDL current in the activated mode of the driver circuit 100. Consequently, how to reduce the GIDL current in both modes has become a critical issue to be solved.

SUMMARY OF THE INVENTION

One embodiment of the present invention discloses a level shift driver circuit. The level shift driver circuit comprises a level shift circuit and a driver circuit. The level shift circuit comprises a first system voltage terminal for receiving a driving voltage, a second system voltage terminal for receiving a system base voltage, a first input terminal for receiving a first input signal, a second input terminal for receiving a second input signal, and a first output terminal. The second input signal is an inverse signal of the first input signal. The first driver circuit comprises a first P-type transistor, a second P-type transistor, a first N-type transistor, and a second N-type transistor. The first P-type transistor has a first terminal coupled to the first system voltage terminal, a second terminal, and a control terminal coupled to the first output terminal. The second P-type transistor has a first terminal coupled to the second terminal of the first P-type transistor, a second terminal, and a control terminal. The first N-type transistor has a first terminal coupled to the second terminal of the second P-type transistor, a second terminal, and a control terminal for receiving an operational high voltage. The second N-type transistor has a first terminal coupled to the second terminal of the first N-type transistor, a second terminal coupled to the second system voltage terminal, and a control terminal coupled to the first output terminal. When the first input signal is at the operational high voltage, a voltage level of the first output terminal is at the system base voltage. When the first input signal is at the system base voltage, the voltage level of the first output terminal is at the driving voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
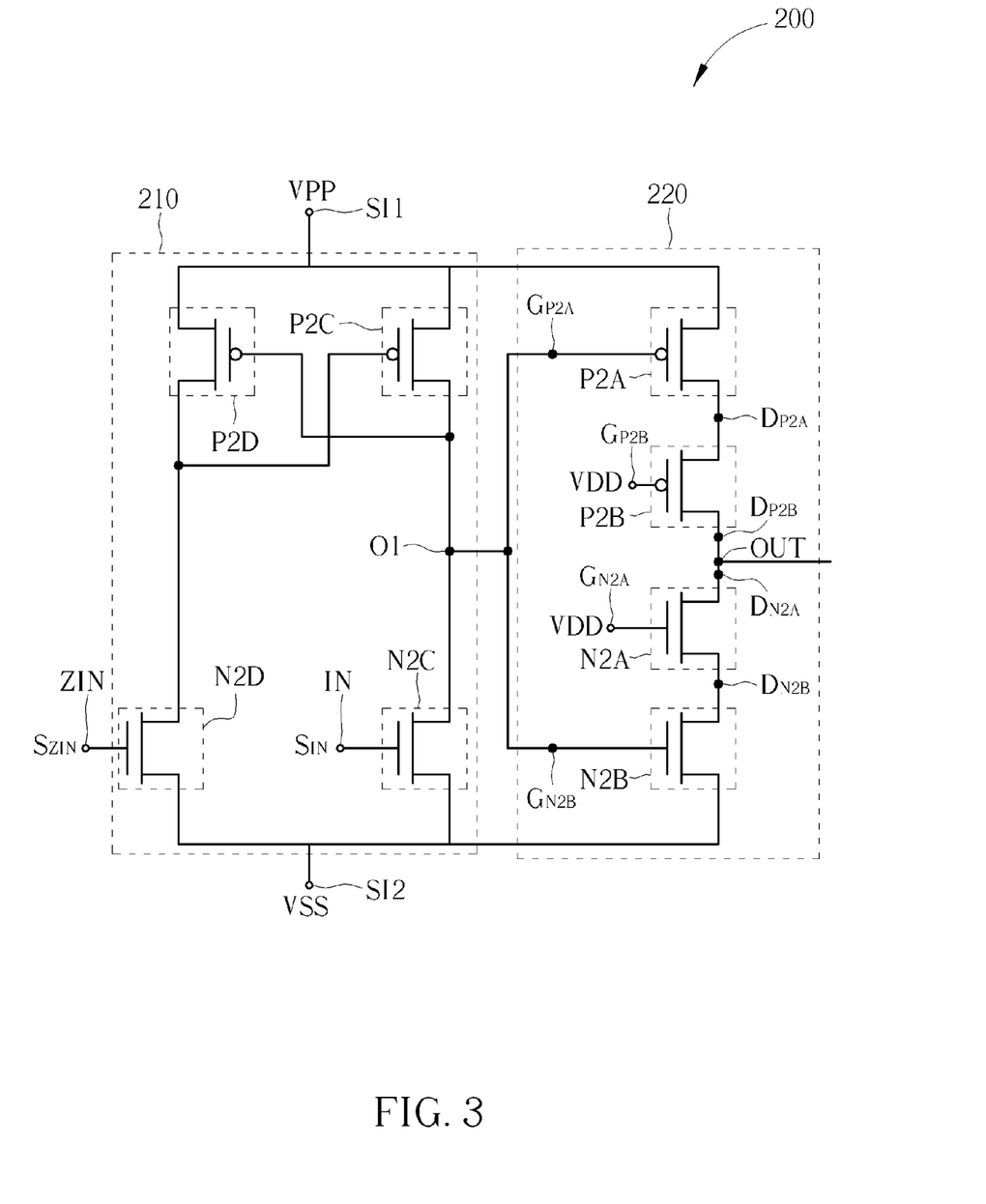
FIG. 3 shows a level shift driver circuit according to one embodiment of the present invention.

FIG. 3 shows a level shift driver circuit 200 according to one embodiment of the present invention. The level shift driver circuit 200 comprises a level shift circuit 210 and a driver circuit 220.

The level shift circuit 210 comprises a first system voltage terminal SI1, a second system voltage terminal SI2, a first input terminal IN, a second input terminal ZIN and a first output terminal O1. The first system voltage terminal SI1 can receive a driving voltage VPP. In some embodiments of the present invention, the level shift driver circuit 200 may further comprise a voltage pumping circuit for generating the driving voltage VPP. In some other embodiments of the present invention, the driving voltage VPP can be generated by an external circuit. The second system voltage terminal SI2 can receive a system base voltage VSS. In some embodiments of the present invention the system base voltage VSS can be lower than the driving voltage VPP and can be the ground voltage of a system comprising the level shift driver circuit 200. The first input terminal IN can receive a first input signal $S_{IN}$. The second input terminal ZIN can receive a second input signal $S_{ZIN}$. In some embodiments of the present invention, the second input signal $S_{ZIN}$ is an inverse signal of the first input signal $S_{IN}$.

In some embodiments of the present invention, the driver circuit 220 comprises a P-type transistor P2A, a P-type transistor P2B, an N-type transistor N2A and an N-type transistor N2B. The P-type transistor P2A has a first terminal coupled to the first system voltage terminal SI1, a second terminal $D_{p2A}$, and a control terminal $G_{p2A}$ coupled to the first output terminal O1. The P-type transistor P2B has a first terminal coupled to the second terminal $D_{p2A}$ of the P-type transistor P2A, a second terminal $D_{p2B}$, and a control terminal $G_{p2B}$. The N-type transistor N2A has a first terminal DN2A coupled to the second terminal Dp2B of the P-type transistor P2B, a second terminal, and a control terminal $G_{N2A}$ for receiving an operative voltage VDD. The N-type transistor N2B has a first terminal $D_{N2B}$ coupled to the second terminal of the N-type transistor N2A, a second terminal coupled to the second system voltage terminal SI2, and a control terminal $G_{N2B}$ coupled to the first output terminal O1. In some embodiments of the preset invention, the driving voltage VPP is greater than the operative voltage VDD, for example, but not limited to, the driving voltage VPP can be 2 to 3 times the operative voltage VDD. In FIG. 3, the second terminal $D_{P2B}$ of the P-type transistor P2B is also used as the driver output terminal OUT of the level shift driver circuit 200.

In some embodiments of the present invention, the level shift circuit 210 comprises a P-type transistor P2C, a P-type transistor P2D, an N-type transistor N2C, and an N-type transistor N2D. The P-type transistor P2C has a first terminal coupled to the first system voltage terminal SI1, a second terminal coupled to the first output terminal O1, and a control terminal. The P-type transistor P2D has a first terminal coupled to the first system voltage terminal SI1, a second terminal coupled to the control terminal of the P-type transistor P2C, and a control terminal coupled to the first output terminal O1. The N-type transistor N2C has a first terminal coupled to the first output terminal O1, a second terminal coupled to the second system voltage terminal SI2, and a control terminal coupled to the first input terminal IN. The N-type transistor N2D has a first terminal coupled to the second terminal of the P-type transistor P2D, a second terminal coupled to the second system voltage terminal SI2, and a control terminal coupled to the second input terminal ZIN. However, the level shift circuit 210 is not limited to the structure shown in FIG. 3, different kinds of level shift circuits may also be used to switch the voltage level of the first output terminal O1 according to the first input signal $S_{IN}$ and the second input signal $S_{ZIN}$ as long as a voltage level of the first output terminal O1 is at the system base voltage VSS when the first input signal $S_{IN}$ is at the operative voltage VDD, and the voltage level of the first output terminal O1 is at the driving voltage VPP when the first input signal $S_{IN}$ is at the system base voltage VSS.

Figure 4:
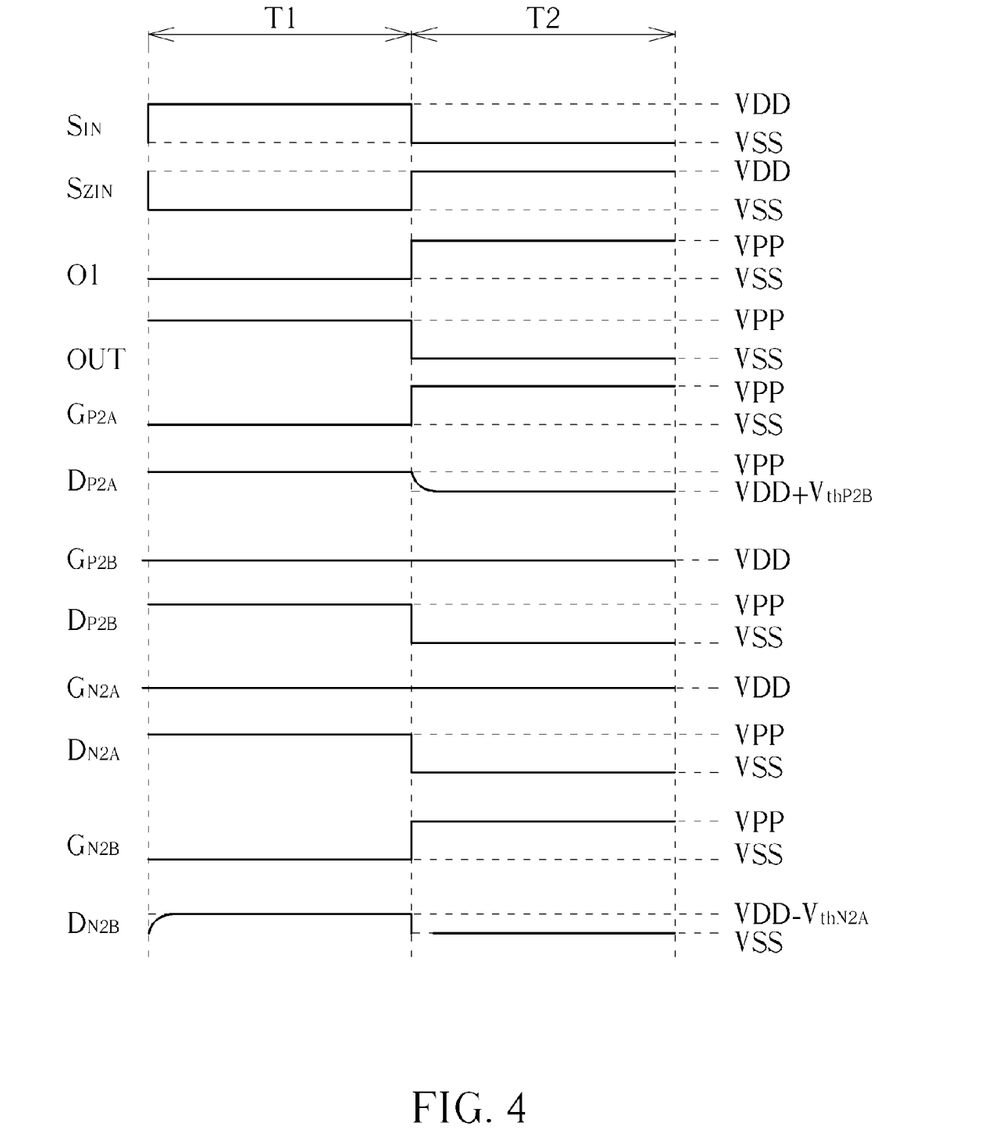
FIG. 4 shows the timing diagram of the level shift driver circuit in FIG. 3.

FIG. 4 shows a timing diagram of the level shift driver 200 according to one embodiment of the present invention. In FIG. 4, during the period of T1, the first input signal $S_{IN}$ is at the operative voltage VDD, the second input signal $S_{ZIN}$ is at the system base voltage VSS. Therefore, the N-type transistor N2C is turned on and the voltage level of the first output terminal O1 is at the system base voltage VSS. The P-type transistor P2A is turned on. In FIG. 4, the control terminal $G_{P2B}$ of the P-type transistor P2B can receive the operative voltage VDD. Since the driving voltage VPP is higher than the operative voltage VDD, the P-type transistor P2B is also turned on and the voltage level of the driver output terminal OUT is pulled up to the driving voltage VPP. In addition, the N-type transistor N2B is turned off. Since the voltage level of the control terminal $G_{N2A}$ of the N-type transistor N2A is at the operative voltage VDD, the voltage level of the control terminal $G_{N2A}$ of the N-type transistor N2A may be higher than the voltage level of the second terminal of the N-type transistor N2A, that is the first terminal $D_{N2B}$ of the N-type transistor N2B, due to the previous operations. Thus, the N-type transistor N2A may be turned on in the beginning of the period of T1. However, the N-type transistor N2A will finally be turned off in the end of period of T1 when the voltage level of the first terminal $D_{N2B}$ of the N-type transistor N2B is pulled up to the operative voltage VDD minus the threshold voltage $V_{thN2A}$ of the N-type transistor N2A, namely VDD–$V_{thN2A}$, by the P-type transistors P2A and P2B. Consequently, the voltage difference between the control terminal $G_{N2A}$ and the first terminal $D_{N2A}$ of the N-type transistor N2A is equal to VPP–VDD, which is less than VPP—VSS as in the prior art. Namely, the GIDL current caused on the N-type transistor N2A is reduced. In addition, the voltage difference between the control terminal $G_{N2B}$ and the first terminal $D_{N2B}$ of the N-type transistor N2B is equal to VDD–$V_{thN2A}$–VSS, which is also less than VPP–VSS. Therefore, both GIDL currents on the N-type transistors N2A and N2B are reduced significantly when the level shift driver circuit 200 is in an activated mode, that is, when the voltage level of the driver output terminal OUT is at the driving voltage VPP.

In FIG. 4, during the period of T2, the first input signal $S_{IN}$ is at the system base voltage VSS, the second input signal $S_{ZIN}$ is at the operative voltage VDD. Therefore, the N-type transistor N2D is turned on and the P-type transistor P2C is also turned on so the voltage level of the first output terminal O1 is pulled up to the driving voltage VPP. The N-type transistor N2B is turned on and the N-type transistor N2A is also turned on. The voltage level of the driver terminal OUT is pulled down to the system base voltage VSS. The P-type transistor P2A is turned off. Since the voltage level of the first terminal of the P-type transistor P2B, or the second terminal $D_{P2A}$ of the P-type transistor P2A, may still at the driving voltage VPP according to the operation in the period of T1. Thus, the P-type transistor P2B may be turned on in the beginning of the period of T2. However, the P-type transistor P2B will finally be turned off when the voltage level of the first terminal of the P-type transistor P2B, or the second terminal $D_{P2A}$ of the P-type transistor P2A, is pulled down to VDD+$V_{thp2B}$ by the N-type transistors N2A and N2B, where $V_{thp2B}$ denotes for the threshold voltage of the P-type transistor P2B. Consequently, the voltage difference between the control terminal $G_{P2A}$ and the second terminal $D_{P2A}$ of the P-type transistor P2A is equal to VPP–(VDD+$V_{thp2B}$), which is less than VPP–VSS, so the GIDL current caused on the P-type transistor P2A is reduced. In addition, the voltage difference between the control terminal $G_{P2B}$ and the second terminal $D_{P2B}$ of the P-type transistor P2B is equal to VDD–VSS, which is also less than VPP–VSS. Namely, both GIDL currents on the P-type transistors P2A and P2B are reduced significantly when the level shift driver circuit 200 is in a standby mode, that is, when the voltage level of the driver output terminal OUT is at the system base voltage VSS.

In another embodiment of the present invention, the control terminal $G_{P2B}$ of the P-type transistor P2B can be coupled to the second input terminal $S_{ZIN}$. In this case, during the period of T1, the P-type transistor P2B can be fully turned on since the second input signal $S_{ZIN}$ is at the system base voltage VSS. Also, during the period of T2, the second input signal $S_{ZIN}$ is at the operative voltage VDD so the operations of the P-type transistor P2B is the same as the aforesaid operations.

Consequently, the level shift driver circuit 200 is able to reduce the GIDL currents on the P-type transistors P2A and P2B during the period of T2, that is, the standby mode of the level shift driver circuit 200. Also, the driver circuit 200 is able to reduce the GIDL currents on the N-type transistors N2A and N2B during the period of T1, that is, the activated mode of the level shift driver circuit 200.

In some embodiments of the present invention, widths of the P-type transistor P2A and the P-type transistor P2B can be greater than widths of the P-type transistor P2C and the P-type transistor P2D because the level shift circuit 210 is used to output control signals and does not require large driving current while the driver circuit 220 is used to output larger driving current with high voltage for the system loads. Similarly, widths of the N-type transistor N2A and the N-type transistor N2B can be greater than widths of the N-type transistor N2C and the N-type transistor N2D.

Furthermore, lengths of the P-type transistor P2A and the P-type transistor P2B can be shorter than lengths of the P-type transistor P2C and the P-type transistor P2D so that the circuit area can be reduced. Similarly, lengths of the N-type transistor N2A and the N-type transistor N2B can be shorter than lengths of the N-type transistor N2C and the N-type transistor N2D.

Figure 5:
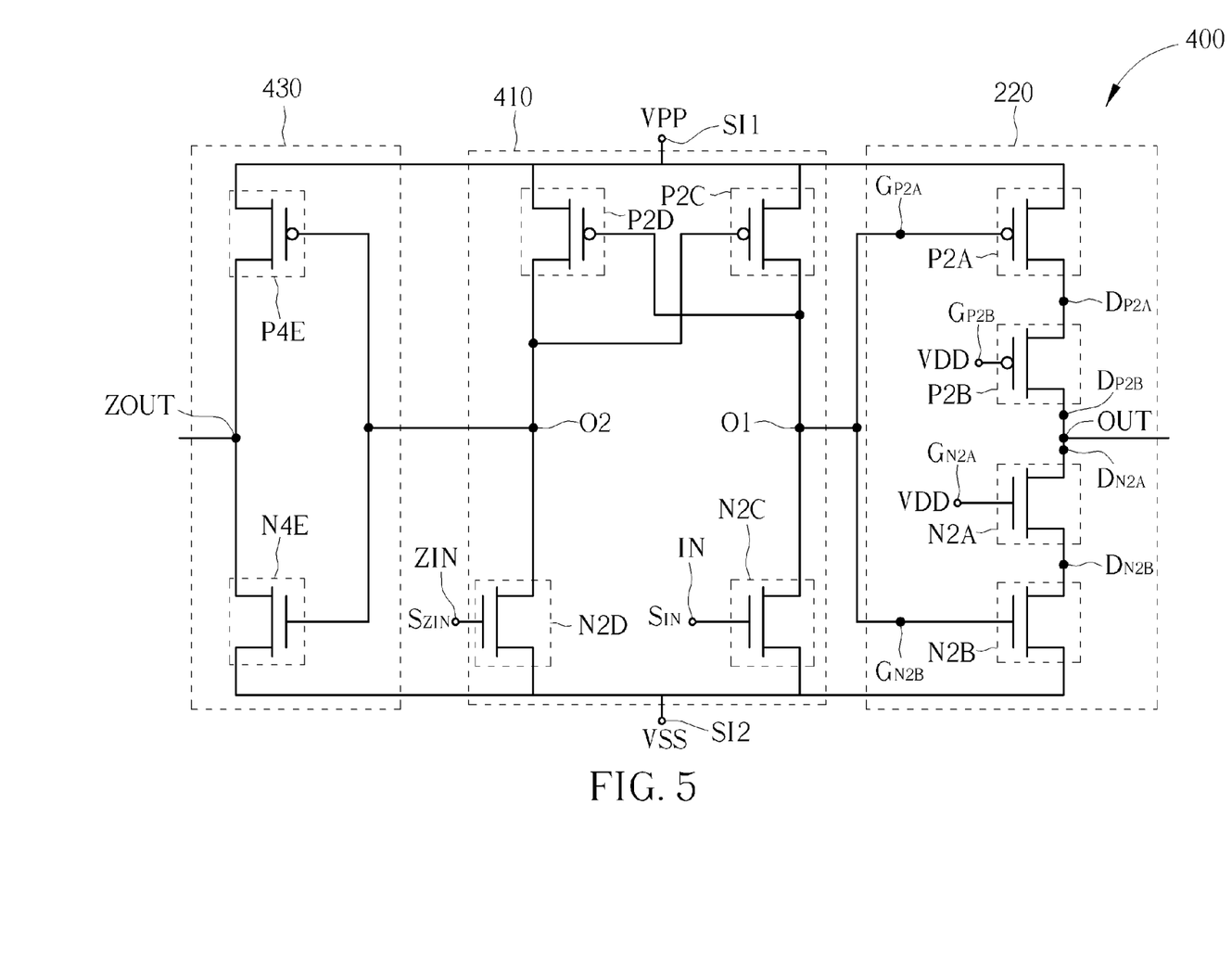
FIG. 5 shows a level shift driver circuit according to another embodiment of the present invention.

FIG. 5 shows a level shift driver circuit 400 according to another embodiment of the present invention. The level shift driver circuit 400 is similar to the level shift driver circuit 200. The difference between the level shift driver circuit 200 and 400 is that the level shift driver circuit 400 comprises the driver circuit 220, a level shift circuit 410 and a driver circuit 430. The level shift circuit 410 is very similar to the level shift circuit 210, but the only difference between these two is that the level shift circuit 410 further comprises a second output terminal O2 coupled to the second terminal of the P-type transistor P2D. The driver circuit 430 comprises a P-type transistor P4E, and an N-type transistor N4E.

The P-type transistor P4E has a first terminal coupled to the first system voltage terminal VPP, a second terminal, and a control terminal coupled to the second output terminal O2. The N-type transistor N4E has a first terminal coupled to the second terminal of the P-type transistor P4E, a second terminal coupled to the second system voltage terminal VSS, and a control terminal coupled to the second output terminal O2. The second terminal of the P-type transistor P4E can be used as a driver output terminal ZOUT of the level shift driver circuit 400.

Since the structure of the driver circuit 430 and the driver circuit 220 are similar but with inverse input signals, the driver circuit 430 can be operated as a complemented counterpart of the driver circuit 220. Namely, when the voltage level of the driver output terminal OUT is at the driving voltage VPP, the voltage level of the driver output terminal ZOUT will be at the system base voltage VSS, and when the voltage level of the driver output terminal OUT is at the system base voltage VSS, the voltage level of the driver output terminal ZOUT will be at the driving voltage VPP.

However, when the voltage level of the output terminal O2 is at the driving voltage VPP and the voltage level of the driver output terminal ZOUT is at the system base voltage VSS, the P-type transistor P4E can suffer a big GIDL current due to the great voltage difference between the control terminal and the second terminal of the P-type transistor P4E. Similarly, when the voltage level of the output terminal O2 is at the system base voltage VSS and the voltage level of the driver output terminal ZOUT is at the driving voltage VPP, the N-type transistor N4E can suffer a big GIDL current due to the great voltage difference between the control terminal and the first terminal of the N-type transistor N4E.

Figure 6:
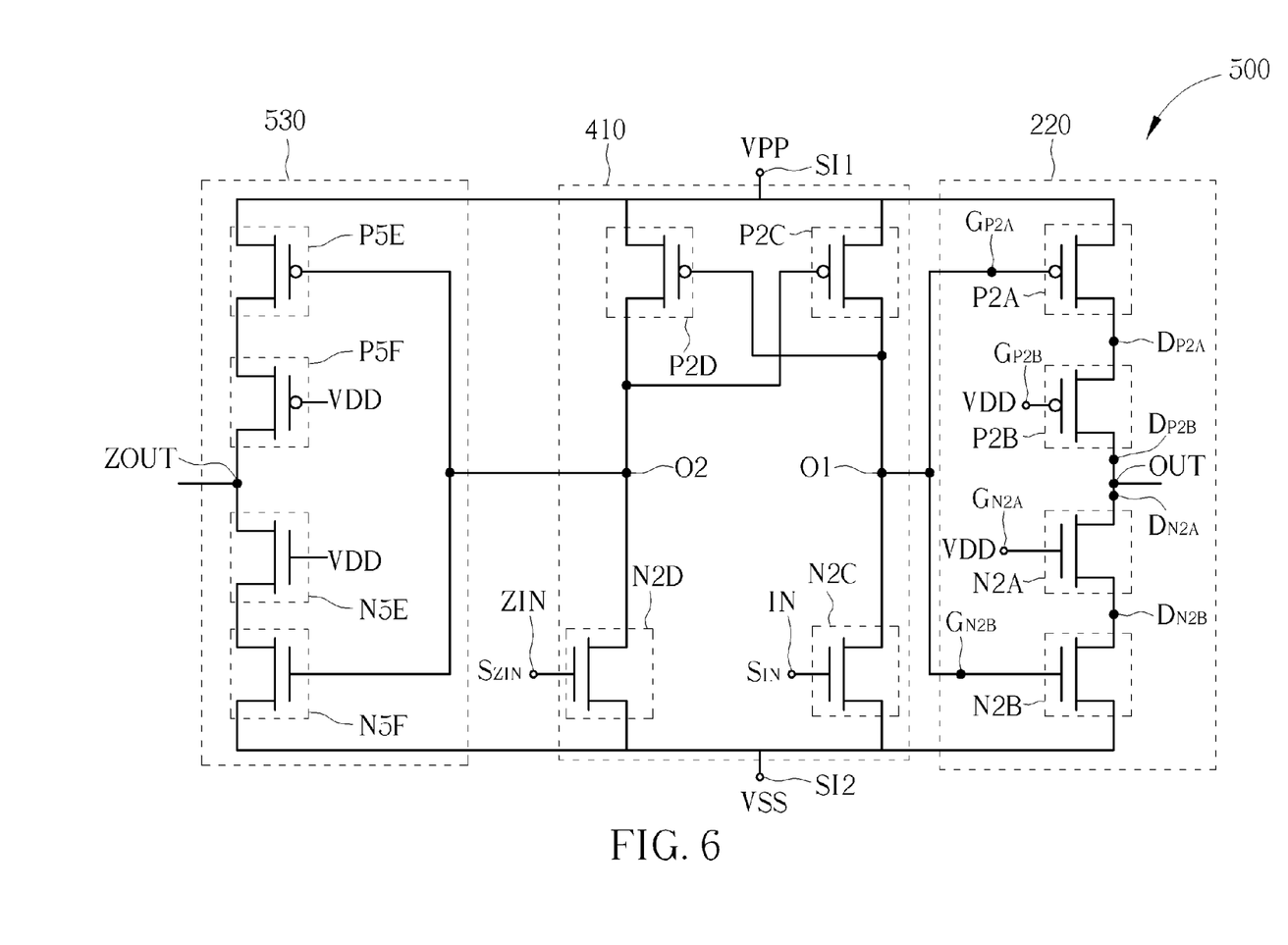
FIG. 6 shows a level shift driver circuit according to another embodiment of the present invention.

The GIDL currents occur on the driver circuit 430 can also be reduced by using the similar structure of the driver circuit 220. FIG. 6 shows a level shift driver circuit 500 according to another embodiment of the present invention. The level shift driver circuit 500 is similar to the level shift driver circuit 400. The difference between the level shift driver circuit 500 and 400 is that the level shift driver circuit 500 comprises a driver circuit 530, instead of the driver circuit 430. The driver circuit 530 comprises a P-type transistor P5E, a P-type transistor P5F, an N-type transistor N5E, and an N-type transistor N5F.

The P-type transistor P5E has a first terminal coupled to the first system voltage terminal SI1, a second terminal, and a control terminal coupled to the second output terminal O2. The P-type transistor P5F has a first terminal coupled to the second terminal of the P-type transistor P5E, a second terminal, and a control terminal coupled to the first input terminal $S_{IN}$ or for receiving the operative voltage VDD. The N-type transistor N5E has a first terminal coupled to the second terminal of the P-type transistor P5F, a second terminal, and a control terminal for receiving the operative voltage VDD. The N-type transistor N5F has a first terminal coupled to the second terminal of the N-type transistor N5E, a second terminal coupled to the second system voltage terminal SI2, and a control terminal coupled to the second output terminal O2.

Since the structure of the driver circuit 530 and the driver circuit 220 are the same but with inverse input signals, the P-type transistor P5E, the P-type transistor P5F, the N-type transistor N5E, and the N-type transistor N5F can be operated as a complemented counterpart of the P-type transistor P2A, the P-type transistor P2B, the N-type transistor N2A, and the N-type transistor N2B respectively.

Furthermore, since the driver circuit 530 has the same structure as the driver circuit 220, the driver circuit 530 can be operated with the same principle as the driver circuit 220 and the GIDL currents on the driver circuit 530 can be reduced significantly.

Figure 7:
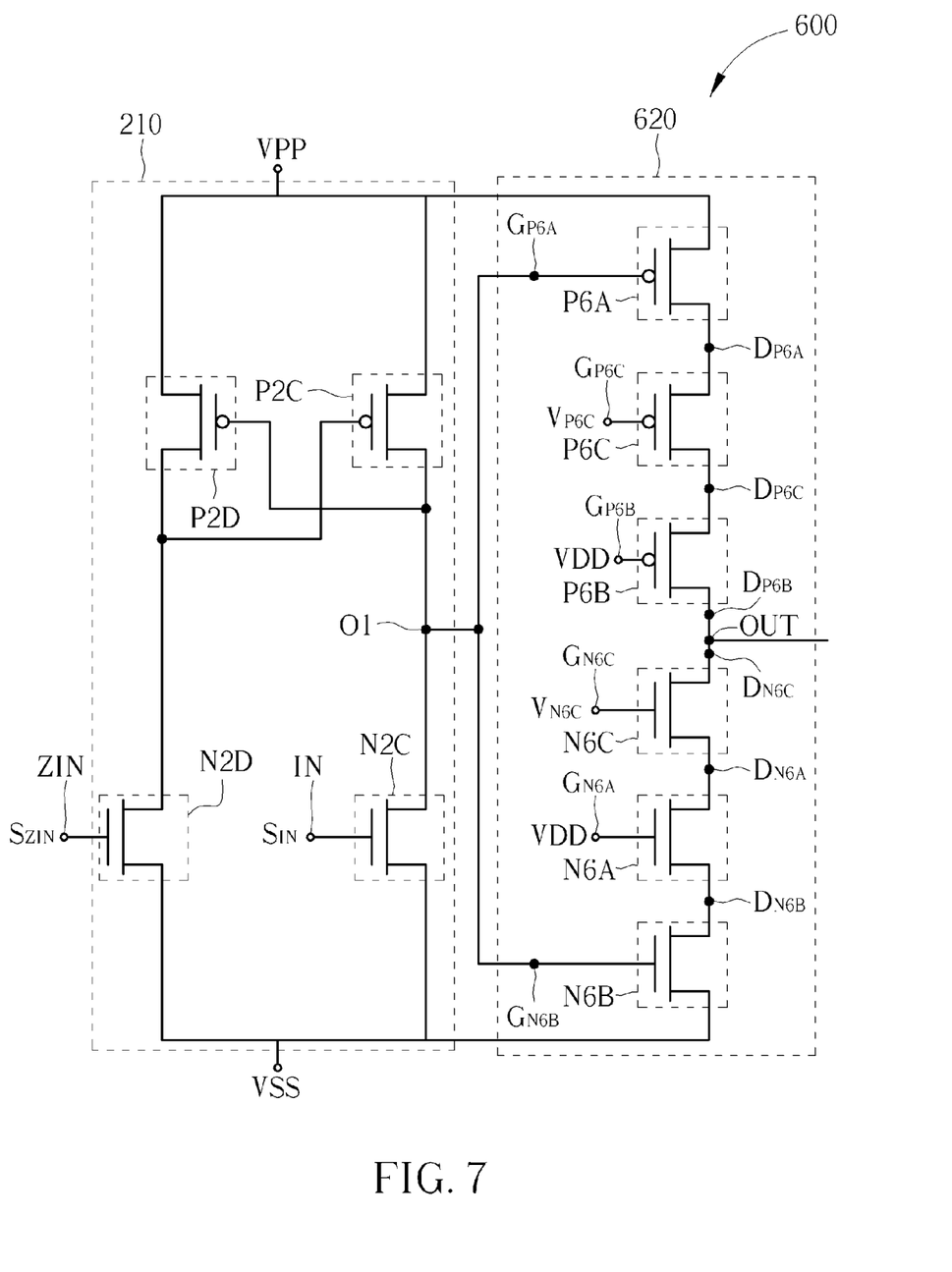
FIG. 7 shows a level shift driver circuit according to another embodiment of the present invention.

FIG. 7 shows a level shift driver circuit 600 according to another embodiment of the present invention. The level shift driver circuit 600 is similar to the level shift driver circuit 200. The difference between the level shift driver circuit 200 and 600 is that the level shift driver circuit 600 comprises a driver circuit 620. The driver circuit 620 is similar to the driver circuit 220, but the driver circuit 620 further comprises P-type transistors P6A, P6B, and P6C. The P-type transistors P6A and P6B can be corresponding to the P-type transistors P2A and P2B in the driver circuit 220 while the P-type transistor P6C is coupled in series between the P-type transistor P6A and P6B.

In some embodiments of the present invention, the voltage levels $V_{P6C}$ of a control terminal of the P-type transistor P6C is between the driving voltage VPP and the voltage level of the control terminal of the P-type transistor P6B. For example, if the driving voltage VPP is three times the operative voltage VDD and the voltage level of the control terminal of the P-type transistor P6B is at the operative voltage VDD, then the voltage level $V_{P6C}$ can be two times the operational voltage VDD (i.e. $V_{P6C}$=2XVDD).

Figure 8:
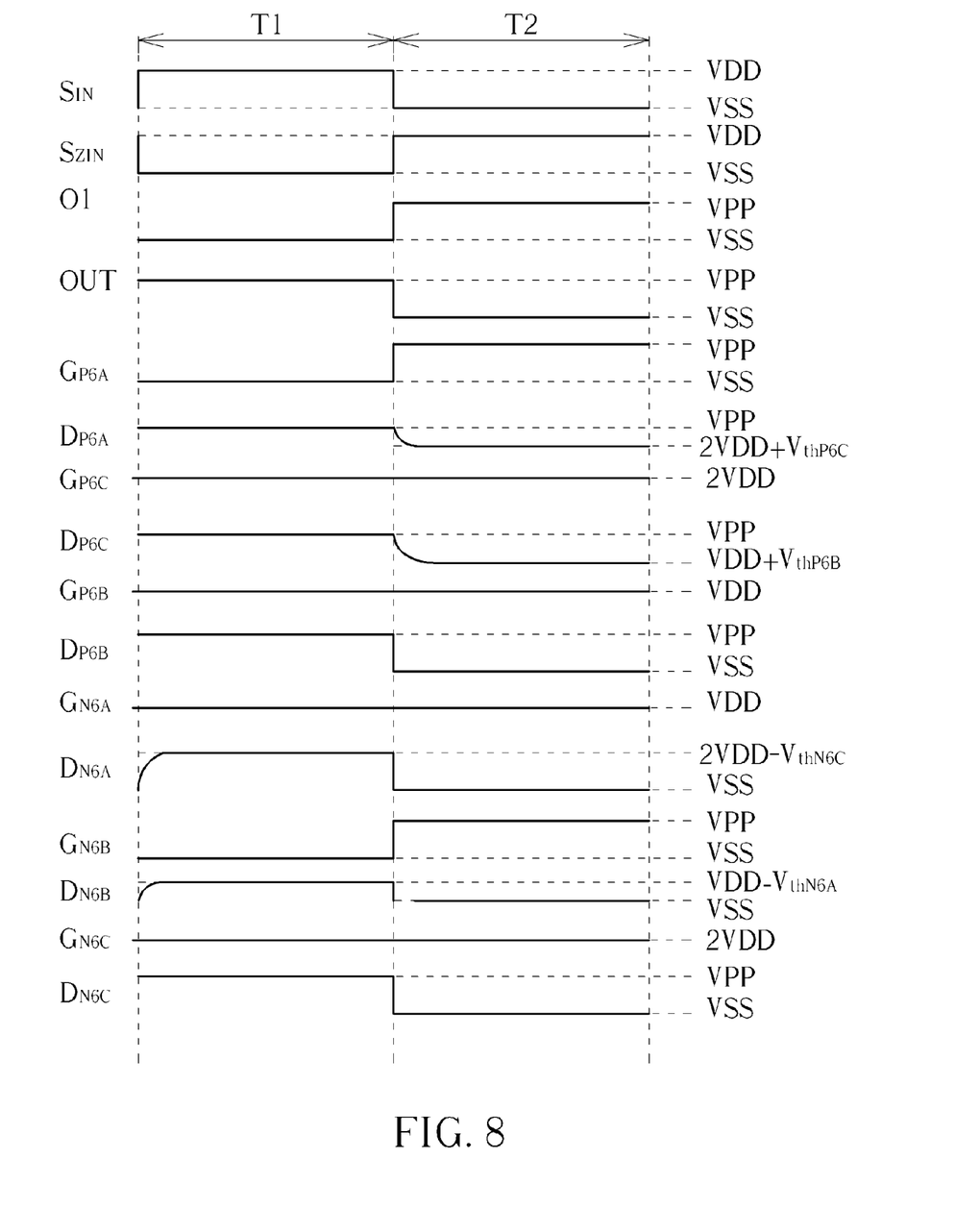
FIG. 8 shows the timing diagram of the level shift driver circuit in FIG. 7.

FIG. 8 shows a timing diagram of the level shift driver 600 according to one embodiment of the present invention. In FIG. 8, during the period of T1, the first input signal $S_{IN}$ is at the operative voltage VDD, the second input signal $S_{ZIN}$ is at the system base voltage VSS. Therefore, the voltage level of the first output terminal O1 is at the system base voltage VSS. The P-type transistor P6A is turned on. Since the driving voltage VPP is three times the operative voltage VDD, the P-type transistor P6B and the P-type transistor P6C are also turned on and the voltage level of the driver output terminal OUT is pulled up to the driving voltage VPP.

During the period of T2, the first input signal $S_{IN}$ is at the system base voltage VSS, the second input signal $S_{ZIN}$ is at the operative voltage VDD. Therefore, the voltage level of the first output terminal O1 is pulled up to the driving voltage VPP. The P-type transistor P6A is turned off. The N-type transistors are turned on so the driver output terminal OUT is at the system base voltage VSS. Since the voltage level of the first terminals of the P-type transistor P6C and P6B (the second terminals $D_{P6A}$ and $D_{P6C}$ of the P-type transistors P6A and P6C), may still at the driving voltage VPP according to the operation in the period of T1, the P-type transistors P6B and P6C may be turned on in the beginning of the period of T2. However, the P-type transistor P6C will finally be turned off when the voltage level of the first terminal of the P-type transistor P6C (the second terminal $D_{P6A}$ of the P-type transistor P6A) is pulled down to 2VDD+$V_{thP6C}$ by the N-type transistors of the driver circuit 620, where $V_{thP6C}$ denotes for the threshold voltage of the P-type transistor P6C. Also, the P-type transistor P6B will finally be turned off when the voltage level of the first terminal of the P-type transistor P6B (the second terminal $D_{P6C}$ of the P-type transistor P6C) is pulled down to VDD+$V_{thP6B}$ by the N-type transistors of the driver circuit 620.

Consequently, the voltage difference between the control terminal $G_{P6A}$ and the second terminal $D_{P6A}$ of the P-type transistor P6A is equal to VPP−(2VDD+$V_{thP6C}$), which is even less than the voltage difference between the control terminal $G_{P2A}$ and the second terminal $D_{P2A}$ of the P-type transistor P2A as in the driver circuit 220. Therefore, the GIDL current caused on the P-type transistor P6A is further reduced. Similarly, the GIDL currents caused on the P-type transistor P6C and the P-type transistor P6B can also be further reduced due to the intermediate voltage supplied to the control terminal of the P-type transistor P6C.

In some embodiments of the present invention, the control terminal of the P-type transistor P6B and the control terminal of the P-type transistor P6C can also receive the system base voltage VSS during the period of T1 in FIG. 7. In this case, the P-type transistors P6B and P6C can be fully turned on when the level shift circuit 600 is activated.

In some embodiments of the present invention, the driver circuit 600 can comprise N-type transistors N6A N6B, and N6C. The N-type transistors N6A and N6B can be corresponding to the N-type transistors N2A and N2B while the N-type transistor N6C is coupled in series between the P-type transistor P6B and the N-type transistor N6A.

In some embodiments of the present invention, the voltage levels $V_{N6C}$ of a control terminal of the N-type transistor N6C is between the driving voltage VPP and the operative voltage VDD. For example, if the driving voltage VPP is three times the operative voltage VDD, then the voltage level $V_{N6C}$ can be two times the operational voltage VDD (i.e. $V_{N6C}$=2XVDD).

In FIG. 8, during the period of T1, the voltage level of the first output terminal O1 is at the system base voltage VSS. The N-type transistor NEB is turned off. Since the voltage level of the second terminals of the N-type transistors NEA and NEC may still at the system base voltage VSS according to the previous operations, the N-type transistors N6B and NEC may be turned on in the beginning of the period of T1. However, the N-type transistor N6A will finally be turned off when the voltage level of the second terminal of the N-type transistor N6A (the first terminal $D_{N6B}$ of the N-type transistor N6B) is pulled up to VDD−$V_{thN6A}$ by the P-type transistors of the driver circuit 620. Also, the N-type transistor NEC will finally be turned off when the voltage level of the second terminal of the N-type transistor NEC (the first terminal $D_{N6A}$ of the N-type transistor NEA) is pulled up to 2VDD−$V_{thN6C}$ by the P-type transistors of the driver circuit 620, where $V_{thN6C}$ denotes for the threshold voltage of the N-type transistor NEC.

Consequently, the voltage difference between the control terminal $G_{N6A}$ and the first terminal $D_{N6A}$ of the N-type transistor NEA is equal to 2VDD−$V_{thN6C}$−VDD, namely VDD−$V_{thN6C}$, which is even less than the voltage difference between the control terminal $G_{N2A}$ and the first terminal $D_{N2A}$ of the N-type transistor N2A as in the driver circuit 220. Therefore, the GIDL current caused on the N-type transistor N2A is further reduced. Similarly, the GIDL currents caused on the N-type transistor NEB can also be further reduced due to the intermediate voltage supplied to the control terminal of the N-type transistor NEC.

During the period of T2, the voltage level of the first output terminal O1 is pulled up to the driving voltage VPP. The N-type transistors NEA, NEB, and NEC are turned on so the voltage level of the driver output terminal OUT is at the system base voltage VSS.

Consequently, the level shift driver circuit 600 is able to reduce the GIDL currents on the P-type transistors PEA, P6B and PEC during the period of T2, that is, the standby mode of the level shift driver circuit 600. Also, the driver circuit 600 is able to reduce the GIDL currents on the N-type transistors NEA, NEB, and NEC during the period of T1, that is, the activated mode of the level shift driver circuit 600.

Although in FIG. 7, the driver circuit 620 only comprises three P-type transistors and three N-type transistors, it is not to limit the present invention. In other embodiments of the present invention, the driver circuit 620 can also comprise other numbers of P-type transistors and N-type transistors according to the system needs.

In summary, according to the shift level driver circuits provided by the embodiments of the present invention, the GIDL currents on the transistors of the driver circuit can be reduced both when the level shift driver circuit is in the activated mode or the standby mode and the power consumption can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A level shift driver circuit, comprising:
a level shift circuit comprising:

a first system voltage terminal (VPP) for receiving a driving voltage;
a second system voltage terminal (VSS) for receiving a system base voltage;
a first input terminal for receiving a first input signal (IN);
a second input terminal for receiving a second input signal (ZIN), wherein the second input signal is an inverse signal of the first input signal; and
a first output terminal; and
a first driver circuit comprising:
a first P-type transistor having a first terminal coupled to the first system voltage terminal, a second terminal, and a control terminal coupled to the first output terminal;
a second P-type transistor having a first terminal coupled to the second terminal of the first P-type transistor, a second terminal, and a control terminal;
a first N-type transistor having a first terminal coupled to the second terminal of the second P-type transistor, a second terminal, and a control terminal for receiving an operative voltage;
a second N-type transistor having a first terminal coupled to the second terminal of the first N-type transistor, a second terminal coupled to the second system voltage terminal, and a control terminal coupled to the first output terminal; and
at least one seventh P-type transistor coupled in series between the first P-type transistor and the second P-type transistor;
wherein:
when the first input signal is at the operative voltage, a voltage level of the first output terminal is at the system base voltage; and
when the first input signal is at the system base voltage, the voltage level of the first output terminal is at the driving voltage.

2. The level shift driver circuit of claim 1, wherein the driving voltage is greater than the operative voltage.

3. The level shift driver circuit of claim 1, wherein the control terminal of the second P-type transistor is coupled to the second input terminal.

4. The level shift driver circuit of claim 1, wherein the control terminal of the second P-type transistor receives the operative voltage.

5. The level shift driver circuit of claim 1, wherein the level shift circuit comprises:
a third P-type transistor having a first terminal coupled to the first system voltage terminal, a second terminal coupled to the first output terminal, and a control terminal;
a fourth P-type transistor having a first terminal coupled to the first system voltage terminal, a second terminal coupled to the control terminal of the third P-type transistor and a control terminal coupled to the first output terminal;
a third N-type transistor having a first terminal coupled to the first output terminal, a second terminal coupled to the second system voltage terminal, and a control terminal coupled to the first input terminal; and
a fourth N-type transistor having a first terminal coupled to the second terminal of the fourth P-type transistor, a second terminal coupled to the second system voltage terminal, and a control terminal coupled to the second input terminal.

6. The level shift driver circuit of claim 5, wherein widths of the first P-type transistor and the second P-type transistor are greater than widths of the third P-type transistor and the fourth P-type transistor.

7. The level shift driver circuit of claim 5, wherein lengths of the first P-type transistor and the second P-type transistor are shorter than lengths of the third P-type transistor and the fourth P-type transistor.

8. The level shift driver circuit of claim 5, wherein:
the level shift circuit further comprises a second output terminal coupled to the second terminal of the fourth P-type transistor; and
the level shift driver circuit further comprises a second driver circuit comprising:
a fifth P-type transistor having a first terminal coupled to the first system voltage terminal, a second terminal, and a control terminal coupled to the second output terminal; and
a fifth N-type transistor having a first terminal coupled to the second terminal of the fifth P-type transistor, a second terminal coupled to the second system voltage terminal, and a control terminal coupled to the second output terminal.

9. The level shift driver circuit of claim 5, wherein:
the level shift circuit further comprises a second output terminal coupled to the second terminal of the fourth P-type transistor; and
the level shift driver circuit further comprises a second driver circuit comprising:
a fifth P-type transistor having a first terminal coupled to the first system voltage terminal, a second terminal, and a control terminal coupled to the second output terminal; and
a sixth P-type transistor having a first terminal coupled to the second terminal of the fifth P-type transistor, a second terminal, and a control terminal coupled to the first input terminal or for receiving the operative voltage;
a fifth N-type transistor having a first terminal coupled to the second terminal of the sixth P-type transistor, a second terminal, and a control terminal for receiving the operative voltage; and
a sixth N-type transistor having a first terminal coupled to the second terminal of the fifth N-type transistor, a second terminal coupled to the second system voltage terminal, and a control terminal coupled to the second output terminal.

10. The level shift driver circuit of claim 1, wherein a voltage level of a control terminal of each of the at least one seventh P-type transistor is between the driving voltage and a voltage level of the control terminal of the second P-type transistor.

11. A level shift driver circuit, comprising:
a level shift circuit comprising:
a first system voltage terminal (VPP) for receiving a driving voltage;
a second system voltage terminal (VSS) for receiving a system base voltage;
a first input terminal for receiving a first input signal (IN);
a second input terminal for receiving a second input signal (ZIN), wherein the second input signal is an inverse signal of the first input signal; and
a first output terminal; and
a first driver circuit comprising:

a first P-type transistor having a first terminal coupled to the first system voltage terminal, a second terminal, and a control terminal coupled to the first output terminal;

a second P-type transistor having a first terminal coupled to the second terminal of the first P-type transistor, a second terminal, and a control terminal;

a first N-type transistor having a first terminal coupled to the second terminal of the second P-type transistor, a second terminal, and a control terminal for receiving an operative voltage;

a second N-type transistor having a first terminal coupled to the second terminal of the first N-type transistor, a second terminal coupled to the second system voltage terminal, and a control terminal coupled to the first output terminal; and at least one seventh N-type transistor coupled in series between the second P-type transistor and the first N-type transistor;

wherein:

when the first input signal is at the operative voltage, a voltage level of the first output terminal is at the system base voltage; and when the first input signal is at the system base voltage, the voltage level of the first output terminal is at the driving voltage.

12. The level shift driver circuit of claim 11, wherein a voltage level of a control terminal of each of the at least one seventh N-type transistor is between the driving voltage and the operative voltage.

13. The level shift driver circuit of claim 11, wherein the driving voltage is greater than the operative voltage.

14. The level shift driver circuit of claim 11, wherein the control terminal of the second P-type transistor is coupled to the second input terminal.

15. The level shift driver circuit of claim 11, wherein the control terminal of the second P-type transistor receives the operative voltage.

16. The level shift driver circuit of claim 11, wherein the level shift circuit comprises:

a third P-type transistor having a first terminal coupled to the first system voltage terminal, a second terminal coupled to the first output terminal, and a control terminal;

a fourth P-type transistor having a first terminal coupled to the first system voltage terminal, a second terminal coupled to the control terminal of the third P-type transistor and a control terminal coupled to the first output terminal;

a third N-type transistor having a first terminal coupled to the first output terminal, a second terminal coupled to the second system voltage terminal, and a control terminal coupled to the first input terminal; and a fourth N-type transistor having a first terminal coupled to the second terminal of the fourth P-type transistor, a second terminal coupled to the second system voltage terminal, and a control terminal coupled to the second input terminal.

17. The level shift driver circuit of claim 16, wherein widths of the first P-type transistor and the second P-type transistor are greater than widths of the third P-type transistor and the fourth P-type transistor.

18. The level shift driver circuit of claim 16, wherein lengths of the first P-type transistor and the second P-type transistor are shorter than lengths of the third P-type transistor and the fourth P-type transistor.

19. The level shift driver circuit of claim 16, wherein:

the level shift circuit further comprises a second output terminal coupled to the second terminal of the fourth P-type transistor; and the level shift driver circuit further comprises a second driver circuit comprising:

a fifth P-type transistor having a first terminal coupled to the first system voltage terminal, a second terminal, and a control terminal coupled to the second output terminal; and a fifth N-type transistor having a first terminal coupled to the second terminal of the fifth P-type transistor, a second terminal coupled to the second system voltage terminal, and a control terminal coupled to the second output terminal.

20. The level shift driver circuit of claim 16, wherein:

the level shift circuit further comprises a second output terminal coupled to the second terminal of the fourth P-type transistor; and the level shift driver circuit further comprises a second driver circuit comprising:

a fifth P-type transistor having a first terminal coupled to the first system voltage terminal, a second terminal, and a control terminal coupled to the second output terminal; and a sixth P-type transistor having a first terminal coupled to the second terminal of the fifth P-type transistor, a second terminal, and a control terminal coupled to the first input terminal or for receiving the operative voltage;

a fifth N-type transistor having a first terminal coupled to the second terminal of the sixth P-type transistor, a second terminal, and a control terminal for receiving the operative voltage; and a sixth N-type transistor having a first terminal coupled to the second terminal of the fifth N-type transistor, a second terminal coupled to the second system voltage terminal, and a control terminal coupled to the second output terminal.

* * * * *